(12) United States Patent
Huang

(10) Patent No.: US 11,581,204 B2
(45) Date of Patent: Feb. 14, 2023

(54) SEMICONDUCTOR DEVICE MANUFACTURING SYSTEM AND METHOD FOR MANUFACTURING SEMICONDUCTOR DEVICE

(71) Applicant: TAIWAN SEMICONDUCTOR MANUFACTURING COMPANY LTD., Hsinchu (TW)

(72) Inventor: Fung-Chih Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 147 days.

(21) Appl. No.: 17/075,571

(22) Filed: Oct. 20, 2020

(65) Prior Publication Data

US 2022/0122861 A1    Apr. 21, 2022

(51) Int. Cl.
*H01L 21/67* (2006.01)

(52) U.S. Cl.
CPC .. *H01L 21/67207* (2013.01); *H01L 21/67167* (2013.01); *H01L 21/67201* (2013.01)

(58) Field of Classification Search
CPC ......... H01L 21/67201; H01L 21/67207; H01L 21/67167
See application file for complete search history.

(56) References Cited

U.S. PATENT DOCUMENTS

| | | | | |
|---|---|---|---|---|
| 5,304,250 A | * | 4/1994 | Sameshima | H01J 37/3244 156/345.47 |
| 5,578,129 A | * | 11/1996 | Moriya | H01J 37/3244 118/723 MP |
| 5,766,360 A | * | 6/1998 | Sato | H01L 21/67184 118/712 |
| 9,150,964 B2 | * | 10/2015 | Kobayashi | C23C 16/4401 |
| 2011/0308453 A1 | * | 12/2011 | Su | C23C 16/303 118/708 |
| 2014/0377039 A1 | * | 12/2014 | Yang | H01L 21/67201 414/806 |
| 2015/0255257 A1 | * | 9/2015 | Kawabe | H01J 37/3244 156/345.31 |
| 2018/0254207 A1 | * | 9/2018 | Assaf | H01L 21/67161 |

* cited by examiner

*Primary Examiner* — Kaitlin S Joerger

(74) *Attorney, Agent, or Firm* — WPAT Law; Anthony King

(57) ABSTRACT

A semiconductor device manufacturing system is provided. In one embodiment, a load lock chamber of the semiconductor device manufacturing system comprises an internal cavity, a substrate carrier, configured to support and deliver a substrate and a cooling gas inlet module arranged in the internal cavity and adjacent to a first side of the internal cavity. The cooling gas inlet module is configured to discharge a gas toward a second side of the internal cavity to cool down the substrate supported and delivered by the substrate carrier, wherein the second side. The second side is opposite to the first side.

20 Claims, 7 Drawing Sheets

SEMICONDUCTOR DEVICE MANUFACTURING SYSTEM AND METHOD FOR MANUFACTURING SEMICONDUCTOR DEVICE

BACKGROUND

Many tools in a semiconductor manufacturing facility process wafers in a high vacuum environment. Because the wafers travel from one tool to another at atmosphere, each tool has a way of loading the wafers into a transitional vacuum chamber (load lock chamber) to remove the air pressure before they are handled by the machine into its high vacuum environment. Conversely, this same load lock is typically used to return the wafers from high vacuum environment back to atmosphere for removal after being processed.

When a wafer is transported from the transitional vacuum chamber (high temperature and vacuum environment, such as the load lock chamber) into the external environment (low temperature and humidity environment, such as a FOUP), the high-temperature process gases remaining on the wafer contact the external atmosphere and form condensations on the surface of the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
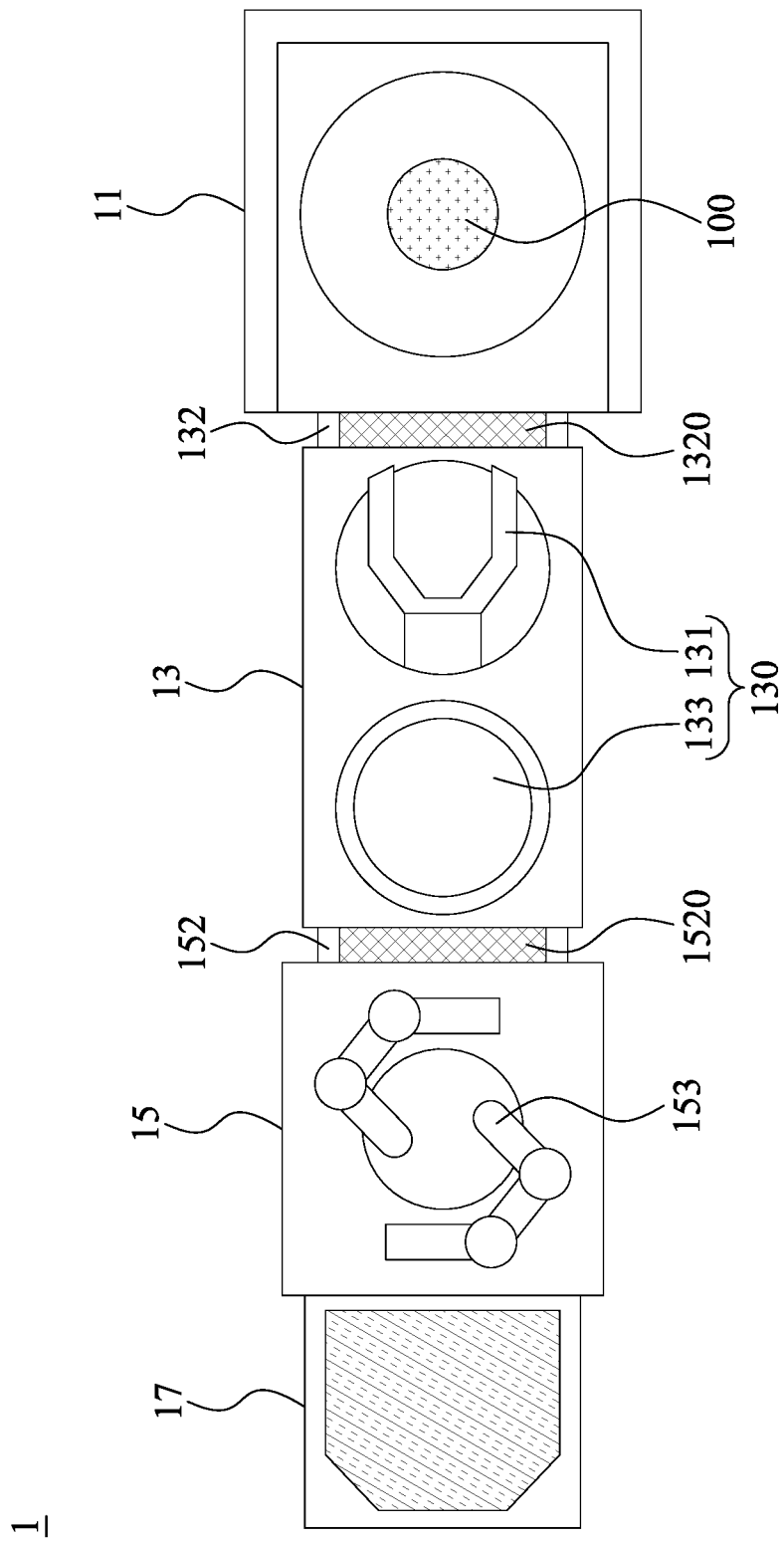
FIG. 1 is a schematic top view of a semiconductor device manufacturing system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

Processing chamber is a vacuum chamber in which the deposition processes like sputtering, electron beam evaporation, or thermal evaporation take place. Load lock chamber, in contrast, is a secondary vacuum chamber that is connected to the process module, separated by a gate valve, and has its own high vacuum pump and vent control.

Present disclosure provides a semiconductor device manufacturing system that reduces the process gas remaining on a substrate after the substrate goes through the process steps and before the substrate is transported to the external environment.

FIG. 1 is a schematic top view of a semiconductor device manufacturing system 1 in accordance with some embodiments of the disclosure. In some embodiments of the present disclosure, the semiconductor device manufacturing system 1 may be configured to process and transport a substrate 100. In some embodiments of the present disclosure, the substrate 100 may be a wafer that includes one or more semiconductor layer(s), conductor(s), and/or insulator layer(s). The semiconductor layer(s) may include an elementary semiconductor such as silicon or germanium with a crystalline, polycrystalline, amorphous, and/or other suitable structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments of the present disclosure, combinations of semiconductors may take the form of a mixture or a gradient such as a wafer in which the ratio of Si and Ge vary across locations. In some embodiments of the present disclosure, the substrate 100 includes layered semiconductors. For example, the layered semiconductors may be disposed on an insulator to produce a silicon-on-insulator (SOI) wafer, a silicon-on-sapphire wafer, or a silicon-germanium-on-insulator wafer. Alternatively, the layered semiconductors may be disposed on a glass to produce a thin film transistor (TFT). In some embodiments of the present disclosure, the wafer 500 may go through many processing steps. For example, the substrate 100 may be subjected to a photolithography process, an etching process, and/or a doping process.

Referring to FIG. 1, the semiconductor device manufacturing system 1 includes a processing chamber 11, a load lock chamber 13, a loading station 15, and a load port 17. In some embodiments of the present disclosure, the load lock chamber 13 is adjacent to the processing chamber 11, the loading station 15 is adjacent to the load lock chamber 12, and the load port 17 is adjacent to the loading station 15. As illustrated in FIG. 1, the processing chamber 11, the load lock chamber 13, the loading station 15, and the load port 17 are spatially connected with each other. In other words, the processing chamber 11, the load lock chamber 13, the loading station 15, and the load port 17 are all communicated with each other. In this way, the substrate 100 may be transported freely among the processing chamber 11, the load lock chamber 13, the loading station 15, and the load port 17.

In some embodiments of the present disclosure, the processing chamber 11 may be configured to perform any manufacturing procedure on the substrate 100. In some embodiments of the present disclosure, the processing chamber 11 may be configured to perform deposition processes. Examples of the deposition processes include a physical vapor deposition (PVD) process, a chemical vapor deposition (CVD) process, a plasma-enhanced chemical vapor deposition (PECVD) process, an electrochemical deposition (ECD) process, a molecular beam epitaxy (MBE) process, an atomic layer deposition (ALD) process, and/or other deposition processes. In some embodiments of the present disclosure, the processing chamber 11 may be configured to perform etching processes. Examples of the etching processes include a wet etching process, a dry etching process, and/or an ion beam milling process. In some alternative embodiments, the processing chamber 11 may be configured to perform a photolithographic exposure process, an ion implantation process, a thermal process (such as an annealing process and/or a thermal oxidation process), a cleaning process (such as a rinsing process and/or a plasma ashing process), a chemical mechanical polishing (CMP) process, a testing process, and/or a combination thereof.

The load lock chamber 13 is arranged between the processing chamber 11 and the loading station 15. The load lock chamber 13 may be configured to preserve the atmosphere within the processing chamber 11 by separating the processing chamber 11 from the loading station 15. Referring to FIG. 1, a substrate loading/unloading port 132 is provided on the side of the load lock chamber 13 that is in contact with the processing chamber 11. The substrate loading-unloading port 132 is opened or closed by a gate valve (GV) 1320. The substrate 100 is loaded into or unloaded from the processing chamber 11 via the substrate loading/unloading port 132.

In some embodiments of the present disclosure, the load lock chamber 13 includes a substrate carrier 130. In some embodiments of the present disclosure of the present disclosure, the substrate carrier 130 includes a transportation fork 131 and a stage 133. The transportation fork 131 may be connected to a transportation robot arm (not shown) such that the transportation fork is able to rotate freely. In some embodiments of the present disclosure, the transportation fork 131 may be inserted into the processing chamber 11 to acquire a processed substrate (i.e. the substrate 100). Thereafter, the transportation fork 131 may transport the substrate 100 onto the stage 133 in the load lock chamber 13. When the wafer 100 is transported from the processing chamber 11 or the loading station 15 into the load lock chamber 13, the load lock chamber 13 is sealed. The load lock chamber 13 is capable of creating an atmosphere compatible with the processing chamber 11 or the loading station 15 depending on where the loaded substrate 100 is scheduled to be next. For example, the gas content within the load lock chamber 13 may be altered to adjust the atmosphere within the load lock chamber 13. The gas content may be adjusted by mechanisms such as addition of gas, creation of vacuum, and/or other suitable methods. When the atmosphere matching the processing chamber 11 or the loading station 15 has been reached, the substrate loading-unloading port 132 of the load lock chamber 13 may be opened by the gate valve 1320, and the substrate 100 located inside of the load lock chamber 13 may be accessed.

The loading station 15 is located between the load lock chamber 13 and the load port 17. Referring to FIG. 1, a substrate loading/unloading port 152 is provided on the side of the loading station 15 that is in contact with the load lock chamber 13. The substrate is transferred into or out of the load lock chamber 13 via the substrate loading/unloading port 152. The substrate loading/unloading port 152 is opened or closed by a gate valve 1520. When the substrate loading/unloading port 152 is opened, the substrate may be loaded into the load lock chamber 13 or unloaded from the load lock chamber 13.

In some embodiments of the present disclosure, the loading station 15 is a facility interface. For example, the loading station 15 may include an equipment front end module (EFEM). In some embodiments of the present disclosure, the loading station 15 includes an automated robot arm 152 for carrying and transporting the substrate 100. The automated robot arm 152 may be able to rotate freely. In some embodiments of the present disclosure, a radial and/or a rotational movement of the automated robot arm 152 can be coordinated or combined to pick up, transport, and/or deliver the substrate 100 from one location to another. For example, the automated robot arm 152 may travel to the load lock chamber 13 to pick up the substrate 100 positioned on the stage 133. Thereafter, the automated robot arm 152 may transport the substrate 100 to the load port 17.

The substrate 100 may be loaded through the load port 17. In some embodiments of the present disclosure, the load port 17 may be configured to accommodate a plurality of cassettes 175. The cassette 175 may be a front-opening unified pod (FOUP), a front-opening shipping box (FOSB), a standard mechanical interface (SMIF) pod, and/or other suitable container. In some embodiments of the present disclosure, the cassettes 175 may be transferred from a stocker (not shown) to the load port LP by an overhead hoist transport (OHT; not shown). In some embodiments of the present disclosure, the cassettes 175 are containers for holding one or more substrate(s) 100 and for transporting the substrate(s) 500 between manufacturing tools. In some embodiments of the present disclosure, the cassettes 174 may have features such as coupling locations and electronic tags to facilitate use with an automated materials handling system. The cassettes 175 are sealed in order to provide a microenvironment for the substrate 100 contained within to avoid contamination. To prevent loss of the controlled atmosphere, each cassette 175 may have a door specifically designed such that the cassette 175 remain sealed until it is docked with the load port 17.

In some embodiments of the present disclosure, the semiconductor device manufacturing system 1 allows the substrate 100 to be transported among the processing chamber 11, the load lock chamber 13, the loading station 15, and the load port 17 in any directions. For example, the substrate 100 may be transported from the processing chamber 11 to the load port 17 by passing through the load lock chamber 13 and the loading station 15 in sequential order. In some alternative embodiments, the substrate 100 may be transported from the load port 17 to the processing chamber 11 by passing through the loading station 15 and the load lock chamber 13 in sequential order.

Figure 2A:
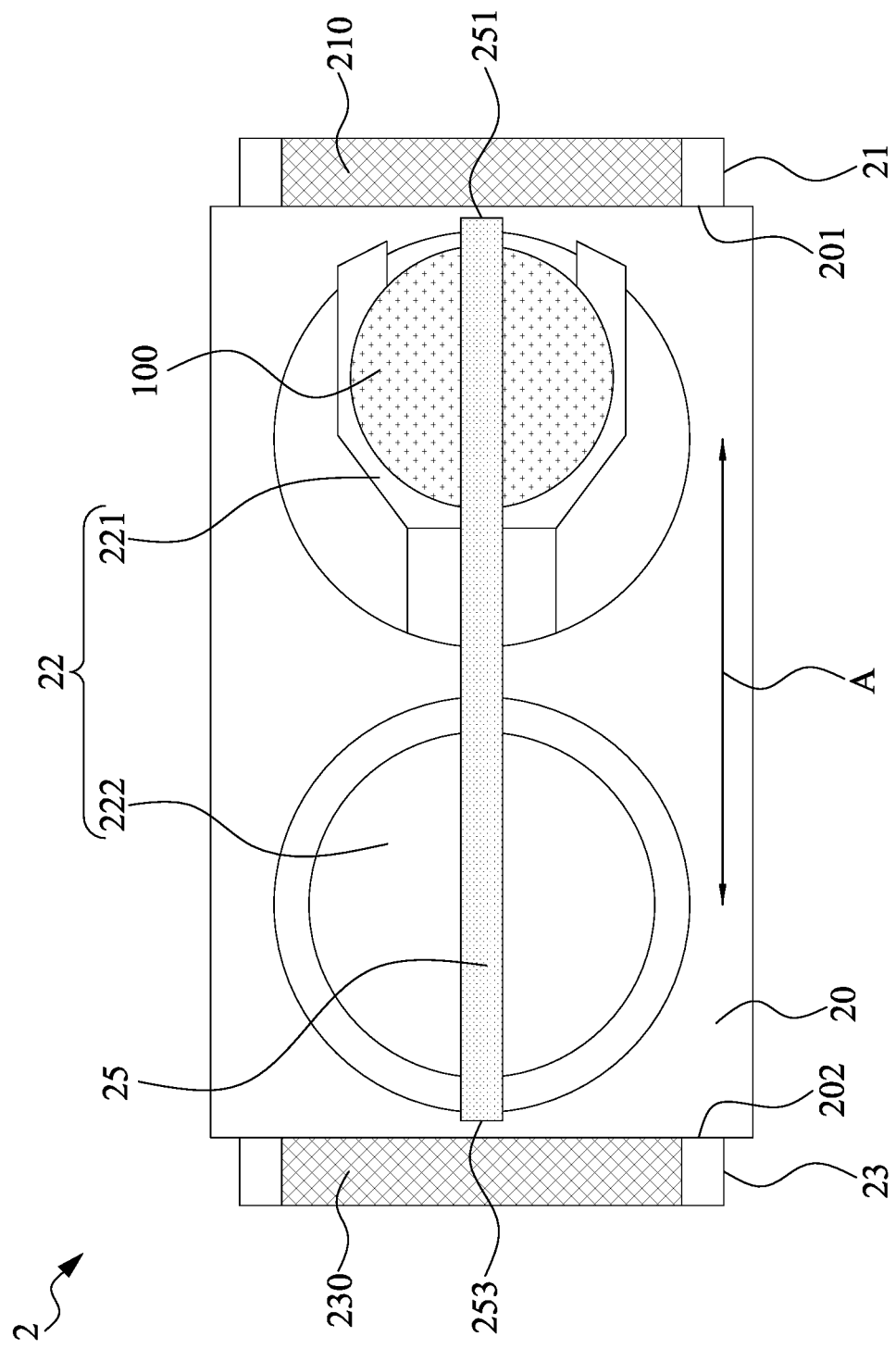
FIG. 2A is a schematic top view of a load lock chamber in accordance with some embodiments of the present disclosure.
Figure 2B:
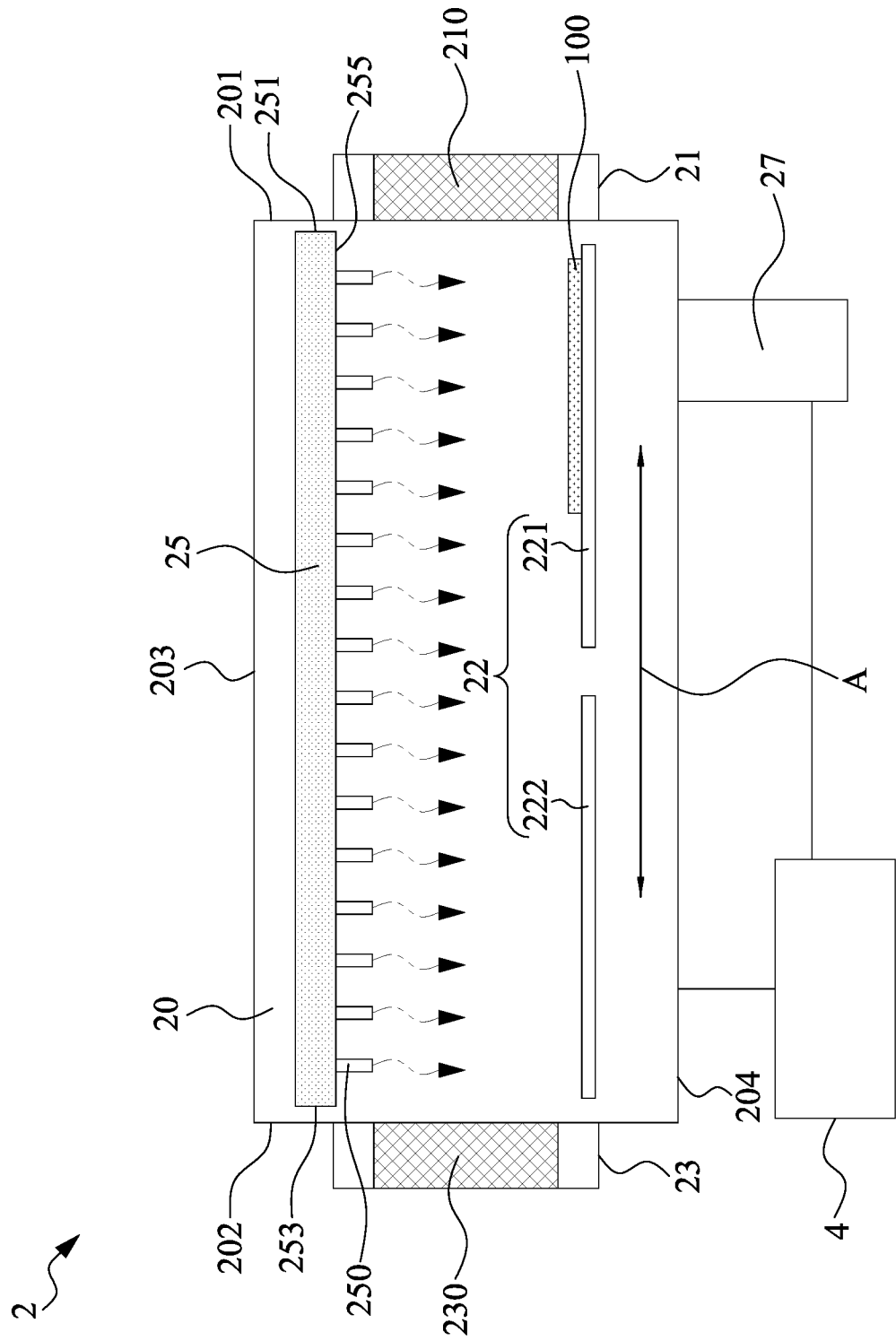
FIG. 2B is a schematic side view of a load lock chamber in accordance with some embodiments of the present disclosure.

FIG. 2A is a schematic top view of a load lock chamber in accordance with some embodiments of the present disclosure. FIG. 2B is a schematic side view of a load lock chamber in accordance with some embodiments of the present disclosure. As shown in FIGS. 2A and 2B, the load lock chamber 2 may include an internal cavity 20. A substrate carrier 22 configured to transport a substrate 100 is arranged within the internal cavity 20 of the load lock chamber 2. In some embodiments of the present disclosure, the substrate carrier 22 includes a transportation fork 221 and a stage 222. The substrate 100 may be moved along a direction A by the substrate carrier 22. Further, a substrate loading/unloading port 21 may be provided at a side 201 of the load lock chamber 2. In some embodiments of the present disclosure, the substrate loading/unloading port 21 further connects to a processing chamber. The substrate loading-unloading port 21 may include a gate valve 210 configured to open and close the substrate loading/unloading port 21. When the gate valve 210 is opened, the internal cavity 20 of the load lock chamber 2 and the inner space of the processing chamber are interconnected to each other. When the gate valve 210 is closed, the internal cavity 20 of the load lock chamber 2 and the inner space of the processing chamber are isolated from each other. In addition, a substrate loading/unloading port 23 which may be provided by a loading station is connected to a side 202 of the load lock chamber 2. In some embodiments of the present disclosure, the side 201 on which the substrate loading/unloading port 21 is provided is opposite to the side 202 to which the substrate loading/unloading port 21 is connected. Further, the substrate loading-unloading port 23 may include a gate valve 230 which is configured to open or close the substrate loading-unloading port 23.

In some embodiments of the present disclosure, the load lock chamber 2 further includes a gas pipeline 25 arranged within the internal cavity 20. As shown in FIG. 2B, the gas pipeline 25 is positioned to be adjacent to a top side 203 of the internal cavity 20. That is, the gas pipeline 25 is positioned above the substrate carrier 22 and the substrate 100 transported by the substrate carrier 22. Further, an end 251 of the gas pipeline 25 may be close to the substrate loading-unloading port 21 and the other end 253 of the gas pipeline 25 may be close to the substrate loading-unloading port 23. In some embodiments of the present disclosure, the gas pipeline 25 extends along the substrate transport direction A. Moreover, referring to FIG. 2B, the gas pipeline 25 includes a number of gas ports 250 at its bottom side 255. The gas ports 250 of the gas pipeline 25 may face the bottom side 204 of the internal cavity 20 of the load lock chamber 2. In some embodiments of the present disclosure, the gas ports 250 are aligned along a lengthwise direction of the gas pipeline 25. That is, at least one of the gas ports 250 may be arranged to be close to the substrate loading-unloading port 21, and at least one of the gas port 250 may be arranged to be close to the substrate loading-unloading port 23.

The gas pipeline 25 is configured to discharge a cooling gas into the internal cavity 20 of the load lock chamber 2 through the gas ports 250. In some embodiments of the present disclosure, the cooling gas includes a clean dry air (CDA). In some embodiments of the present disclosure, the cooling gas includes an inert gas. The inert gas may be selected from the group consisting of: nitrogen, argon, helium, and combinations thereof. In some embodiments of the present disclosure, a temperature of the cooling gas is lower than room temperature. In some embodiments of the present disclosure, a temperature of the cooling gas is lower than 24° C. Referring to FIG. 2B, the gas ports 250 are arranged at the bottom side 255 of the gas pipeline 25, and thus the cooling air may be discharged toward the bottom side 204 of the internal cavity 20 of the load lock chamber 2. That is, the gas pipeline 25 may discharge the cooling air toward the substrate carrier 22 and/or the substrate 100 loaded on the substrate carrier 22. Moreover, since the gas pipeline 25 extends along the substrate direction A and the gas ports are aligned along the gas pipeline 25, the cooling gas discharged from the gas pipeline 25 will not create a turbulent flow inside the internal cavity 20 of the load lock chamber 2.

In some embodiments of the present disclosure, the load lock chamber 2 further comprises a pumping port 27 (see FIG. 2B). The pumping port 27 may be in fluid communication with the internal cavity 20 of the load lock chamber 2 and configured to pump air/gas out of the internal cavity 20 of the load lock chamber 2. In addition, a gas analyzer 4 may be connected to the load lock chamber 2. In some embodiments of the present disclosure, the gas analyzer 4 is configured to directly detect and analyze a composition of the air/gas within the internal cavity 20 of the load lock chamber 2. In some embodiments of the present disclosure, the gas analyzer 4 is configured to detect and analyze a composition of the air/gas within the internal cavity 20 of the load lock chamber 2 through the pumping port 27.

Figure 3A:
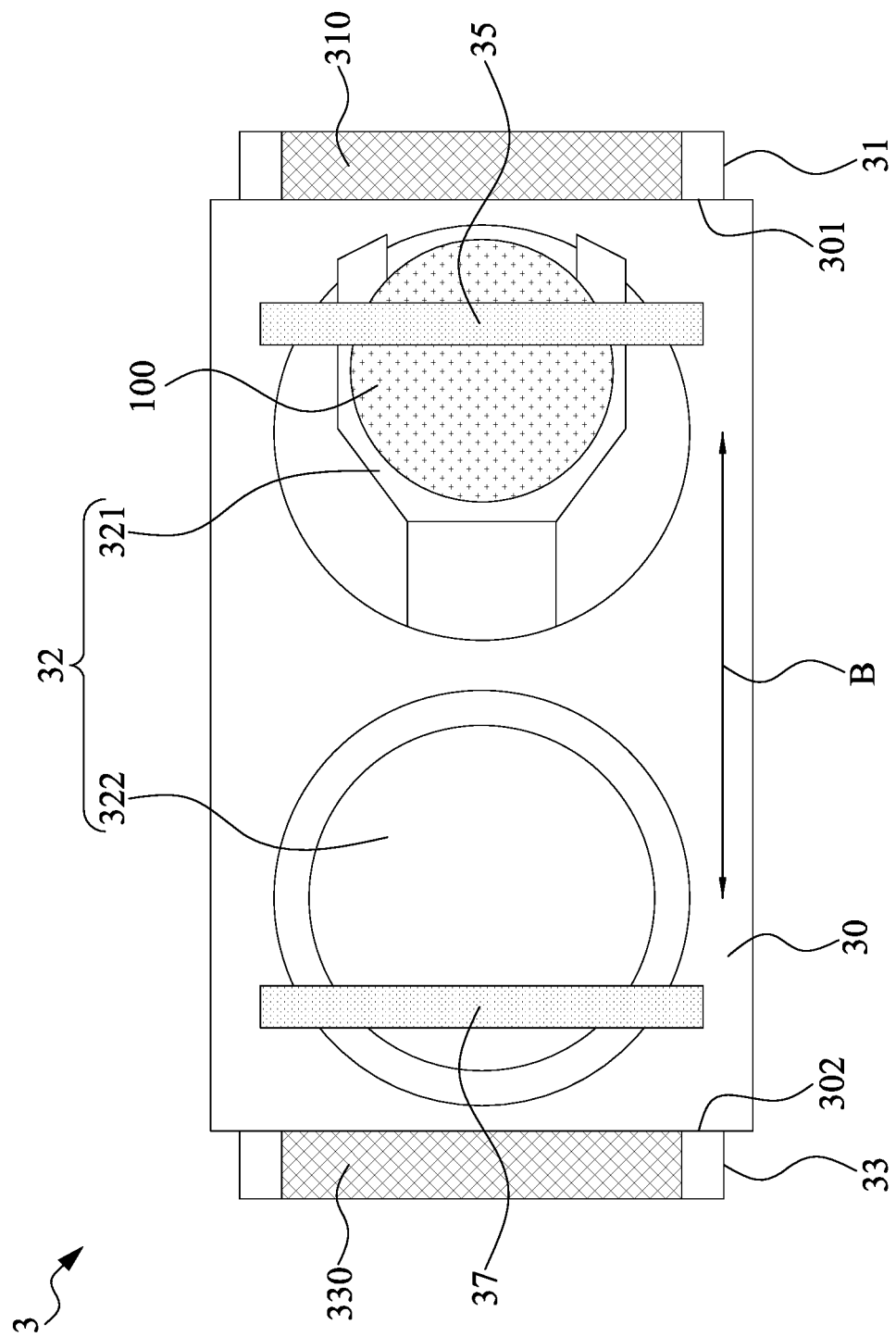
FIG. 3A is a schematic top view of a load lock chamber in accordance with some embodiments of the present disclosure.
Figure 3B:
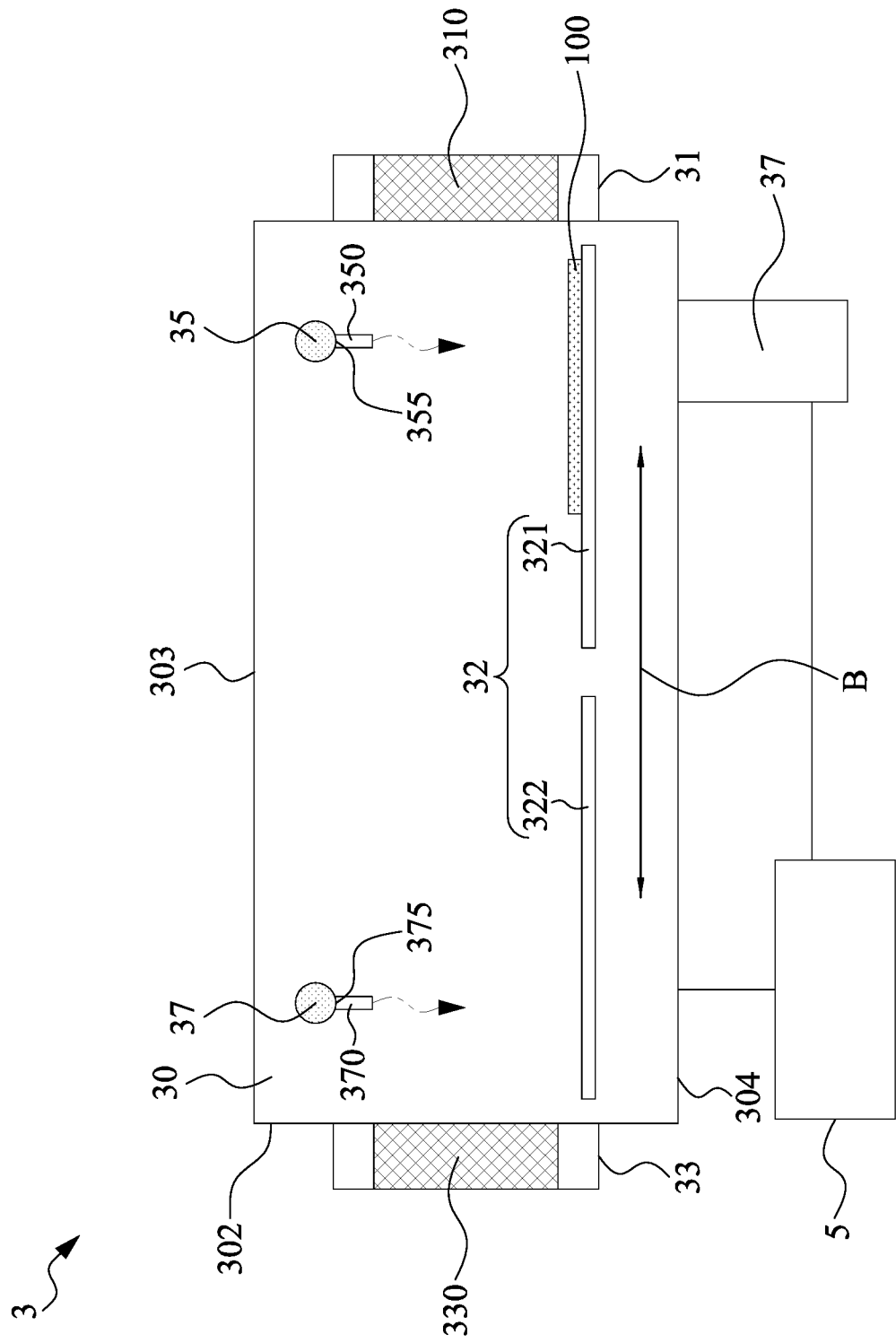
FIG. 3B is a schematic side view of a load lock chamber in accordance with some embodiments of the present disclosure.

FIG. 3A is a schematic top view of a load lock chamber in accordance with some embodiments of the present disclosure. FIG. 3B is a schematic side view of a load lock chamber in accordance with some embodiments of the present disclosure. As shown in FIGS. 3A and 3B, the load lock chamber 3 may include an internal cavity 30. A substrate carrier 32 configured to transport a substrate 100 is arranged within the internal cavity 30 of the load lock chamber 3. In some embodiments of the present disclosure, the substrate carrier 32 includes a transportation fork 321 and a stage 322. The substrate 100 may be moved along a direction B by the substrate carrier 32. Further, a substrate loading/unloading port 31 may be provided at a side 301 of the load lock chamber 32. In some embodiments of the present disclosure, the substrate loading/unloading port 31 further connects to a processing chamber. The substrate loading-unloading port 31 may include a gate valve 310 which is configured to open and close the substrate loading/unloading port 31. When the gate valve 310 is opened, the internal cavity 30 of the load lock chamber 3 and the inner space of the processing chamber are interconnected to each other. When the gate valve 310 is closed, the internal cavity 30 of the load lock chamber 3 and the inner space of the processing chamber are isolated from each other. In addition, a substrate loading/unloading port 33 which may be provided by a loading station is connected to a side 302 of the load lock chamber 3. In some embodiments of the present disclosure, the side 301 on which the substrate loading/unloading port 31 is provided is opposite to the side 302 to which the substrate loading/unloading port 31 is connected. Further, the substrate loading-unloading port 33 may include a gate valve 330 which is configured to open or close the substrate loading-unloading port 33.

In some embodiments of the present disclosure, the load lock chamber 3 further includes two gas pipelines 35 and 37 arranged within the internal cavity 30. As shown in FIG. 3B, the gas pipelines 35 and 37 are positioned to be adjacent to a top side 303 of the internal cavity 30. That is, the gas pipelines 35 and 37 are positioned above the substrate carrier 32 and the substrate 100 transported by the substrate carrier 32. Referring to FIGS. 3A and 3B, the gas pipeline 35 is arranged to be close to the substrate loading-unloading port 31. Further, the gas pipeline 35 extends along a direction which is different from the substrate transport direction B. In some embodiments of the present disclosure, the direction along which the gas pipeline 35 extends is perpendicular to the substrate transport direction B (see FIG. 3A). Moreover, the gas pipeline 37 is arranged to be close to the substrate loading-unloading port 33. Further, the gas pipeline 37 extends along a direction which is different from the substrate transport direction B. In some embodiments of the present disclosure, the direction along which the gas pipeline 37 extends is perpendicular to the substrate transport direction B (see FIG. 3A). Referring to FIG. 3B, the gas pipeline 35 may include at least one gas port 350 at its bottom side 355 and the gas pipeline 37 may include at least one gas port 370 at its bottom side 375. That is, the gas port 350 of the gas pipeline 35 and the gas port of the gas pipeline 37 may face the bottom side 304 of the internal cavity 30 of the load lock chamber 3. In some embodiments of the present disclosure, the gas pipeline 35 includes a number of gas ports 350 arranged at the bottom side 355 of the gas pipeline 35 and aligned along a lengthwise direction of the gas pipeline 35. In some embodiments of the present disclosure, the gas pipeline 37 includes a number of gas ports 370 arranged at the bottom side 375 of the gas pipeline 37 and aligned along a lengthwise direction of the gas pipeline 37.

The gas pipelines 35 and 37 are configured to discharge a cooling gas into the internal cavity 30 of the load lock chamber 3 through the gas ports 350 and 370. In some embodiments of the present disclosure, the cooling gas includes a clean dry air (CDA). In some embodiments of the present disclosure, the cooling gas includes an inert gas. The inert gas may be selected from the group consisting of: nitrogen, argon, helium, and combinations thereof. In some embodiments of the present disclosure, a temperature of the cooling gas is lower than room temperature. In some embodiments of the present disclosure, a temperature of the cooling gas is lower than 24° C. Referring to FIG. 3B, the gas ports 350 and 370 are arranged at the bottom sides 355 and 375 of the gas pipelines 35 and 37, and thus the cooling air may be discharged toward the bottom side 304 of the internal cavity 30 of the load lock chamber 3. That is, the gas pipelines 35 and 37 may discharge the cooling air toward the substrate carrier 32 and/or the substrate 100 loaded on the substrate carrier 32. Moreover, since the gas pipeline 35 is arranged to be close to the substrate loading-unloading port 31 and the gas pipeline 37 is arranged to be close to the substrate loading-unloading port 33, the cooling gas discharged from the gas pipeline 35 and the cooling gas discharged from the gas pipeline 37 will not create a turbulent flow inside the internal cavity 30 of the load lock chamber 3.

In some embodiments of the present disclosure, the load lock chamber 3 further comprises a pumping port 37 (see FIG. 3B). The pumping port 37 may be in fluid communication with the internal cavity 30 of the load lock chamber 3 and configured to pump air/gas out of the internal cavity 30 of the load lock chamber 3. In addition, a gas analyzer 5 may be connected to the load lock chamber 3. In some embodiments of the present disclosure, the gas analyzer 5 is configured to directly detect and analyze a composition of the air/gas within the internal cavity 30 of the load lock chamber 3. In some embodiments of the present disclosure, the gas analyzer 5 is configured to detect and analyze a composition of the air/gas within the internal cavity 30 of the load lock chamber 3 through the pumping port 37.

Figure 4:
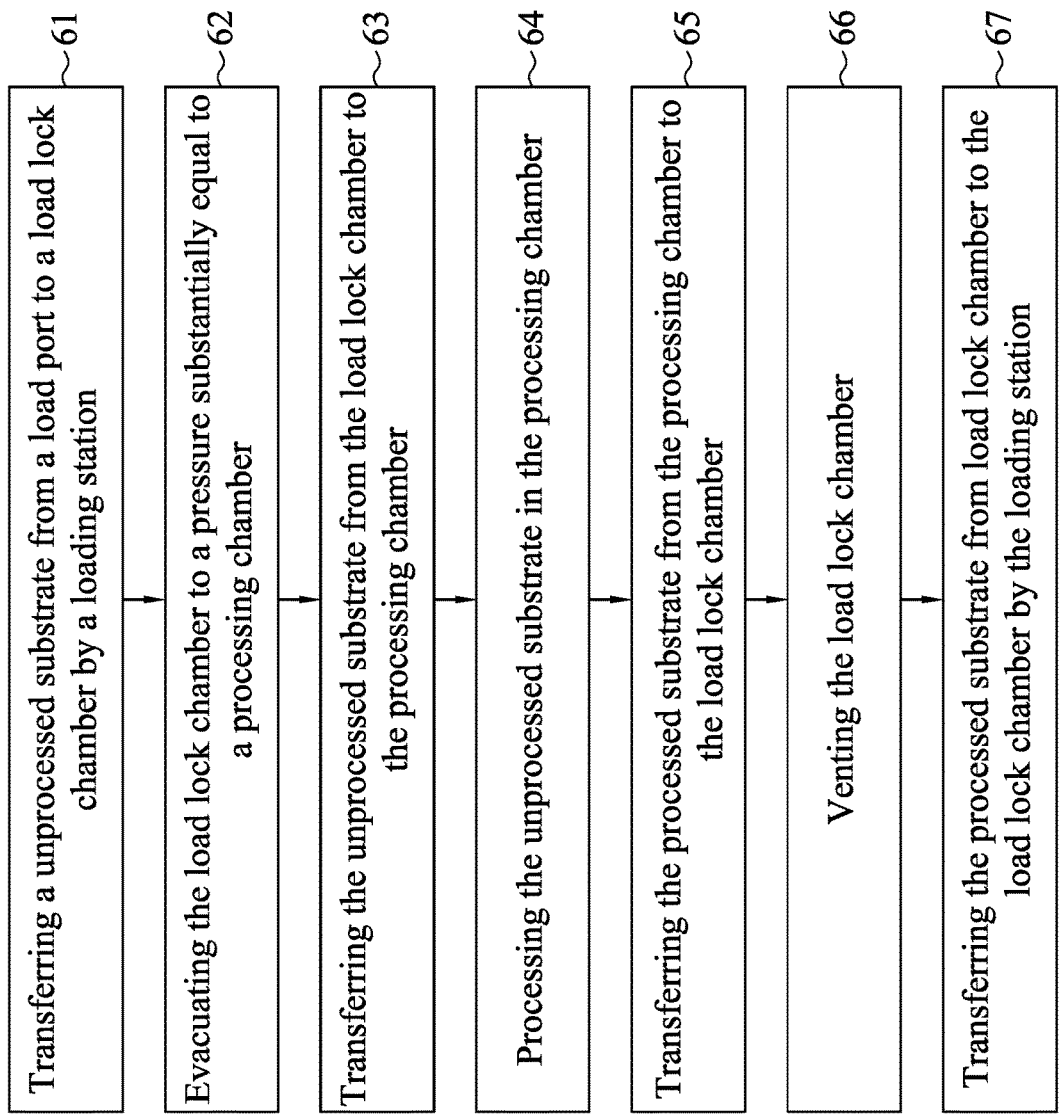
FIG. 4 is a flow chart representing exemplary operations of the method for manufacturing a semiconductor device by the semiconductor device manufacturing system, in accordance with some embodiments of the present disclosure.

FIG. 4 is a flow chart representing exemplary operations of the method for manufacturing a semiconductor device by the semiconductor device manufacturing system, in accordance with some embodiments of the present disclosure.

The method 6 begins at step 61 by transferring an unprocessed substrate 100 from a load port 17 to a load lock chamber 13 by a loading station 15. At step 62, the load lock chamber 13 is evacuated to a pressure substantially equal to a processing chamber 11 which is connected to the load lock chamber.

At step 63, the unprocessed substrate 100 is transferred into the processing chamber 11 from the load lock chamber 13. At step 64, the unprocessed substrate 100 may optionally have one or more processes in the processing chamber 11.

At step 65, the substrate 100 is transferred into the load lock chamber 13 after the substrate 100 has been processed in the processing chamber 11. At step 66, after the processed substrate 100 is transferred from the processing chamber 11 into the load lock chamber 13, the load lock chamber 13 is sealed from the processing chamber 11 and vented to atmosphere. At step 67, the processed substrate 100 is transferred from the load lock chamber 13 to the load port 17 by the loading station 15.

The processed substrate 100 may be further used in the making of a semiconductor device.

Figure 5:
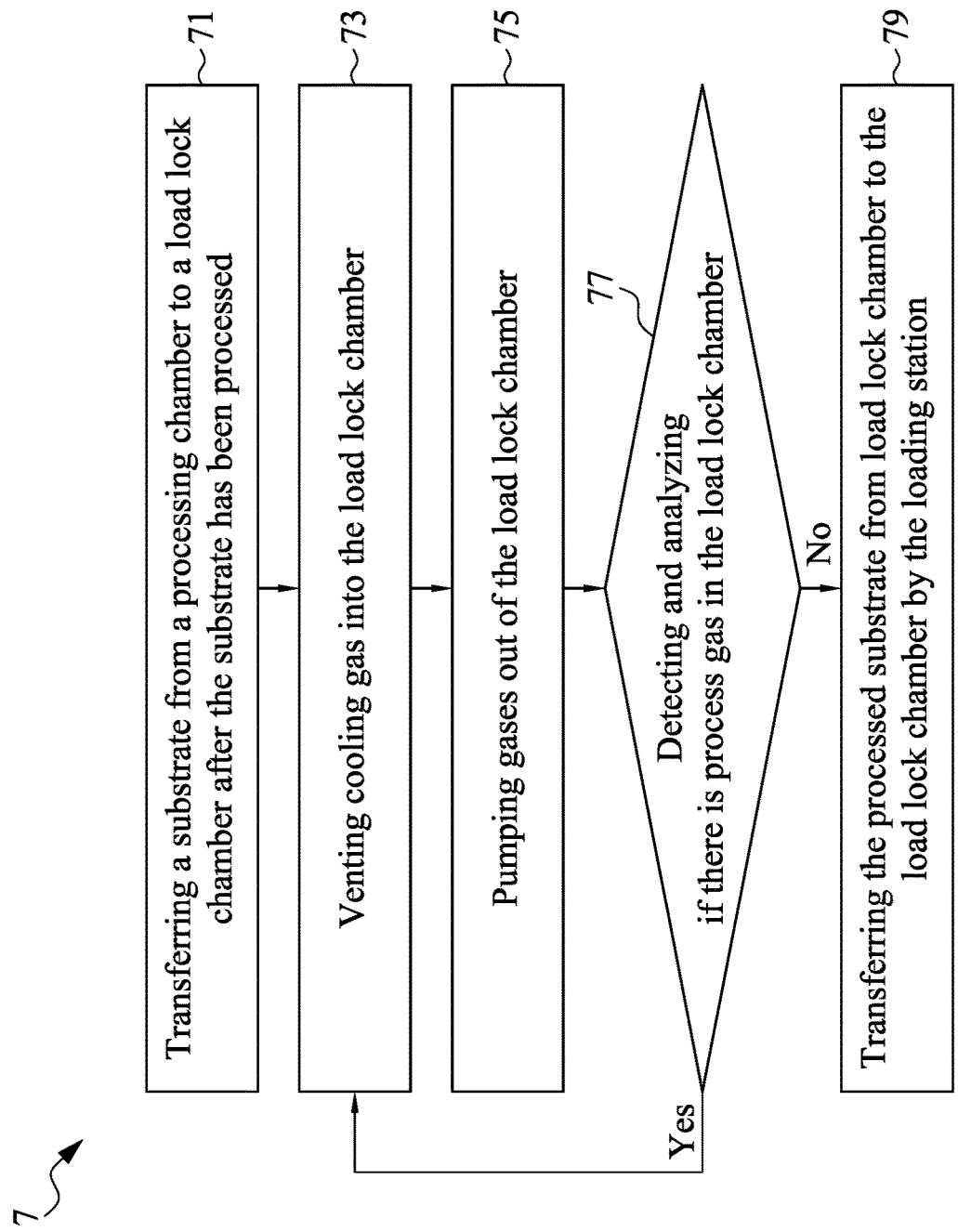
FIG. 5 is a flow chart representing exemplary operations for operating the load lock chamber for transporting a substrate which is used in the making of a semiconductor device, in accordance with some embodiments of the present disclosure.

FIG. 5 is a flow chart representing exemplary operations for operating the load lock chamber for transporting a substrate which is used in the making of a semiconductor device, in accordance with some embodiments of the present disclosure. The method 7 as illustrated in FIG. 5 may be related to an operation of the load lock chamber 2, 3.

At step 71, a substrate 100 which has been processed in the processing chamber is transferred into an internal cavity 20, 30 of a load lock chamber 2, 3. The processed substrate 100 may be hot after transferring from the processing chamber. Further, the surface of the processed substrate 100 may adsorb process gases during processing that may be released in the load lock chamber 2, 3. The releasing of gases may be referred to as outgassing. The process gases may include $CHF_3$, HBr, $C_4F_8$, Ar, $O_2$, $CH_2F_2$, and the like.

At Step 73, a gas pipeline(s) 25, 35 discharge cooling gas into the internal cavity 20, 30 of the load lock chamber 2, 3 through the gas ports 250, 350, 370. In some embodiments of the present disclosure, a temperature of the cooling gas may be lower than room temperature. In some embodiments of the present disclosure, the temperature of the cooling gas is lower than 24° C. Thus, the cooling gas discharged into the internal cavity 20, 30 of the load lock chamber 2, 3 is configured to cool down the processed substrate 100. In some embodiments of the present disclosure, the cooling gas cools down the processed substrate 100 until a temperature of the processed substrate 100 is substantially equal to the room temperature. Further, the cooling gas may include a carrier gas. In some embodiments of the present disclosure, the cooling gas includes an inert gas. The inert gas may be selected from the group consisting of: nitrogen, argon, helium, and combinations thereof. In some embodiments of the present disclosure, the cooling gas includes a clean dry air (CDA).

At step 75, a pumping port 27, 37 is configured to pump the gases out of the internal cavity 20, 30 of the load lock chamber 2, 3. In some embodiments of the present disclosure, the process gas remaining on the surface of the processed substrate 100 and the cooling gas discharged by the gas pipeline(s) 25, 35 are pumped out of the internal cavity 20, 30 of the load lock chamber 2, 3 together.

At step 77, after the gases are pumped out of the internal cavity 20, 30 of the load lock chamber 2, 3, a gas analyzer 4, 5 may detect and analyze a composition of the air/gas within the internal cavity 20, 30 of the load lock chamber 2, 3. In some embodiments of the present disclosure, the gas analyzer 4, 5 is configured to directly detect and analyze a composition of the air/gas within the internal cavity 20, 30 of the load lock chamber 2, 3. In some embodiments of the present disclosure, the gas analyzer 4, 5 is configured to detect and analyze a composition of the air/gas within the internal cavity 20, 30 of the load lock chamber 2, 3 through the pumping port 27, 37. That is, the gas analyzer 4, 5 may detect and analyze the air/gas pumped out of the internal cavity 20, 30 of the load lock chamber 2, 3 through the pumping port 27, 37. If the gas analyzer 4, 5 detects that there is no process gas in the internal cavity 20, 30 of the load lock chamber 2, 3, the loading station 15 may transport the processed substrate 100 from the load lock chamber 2, 3 to a load port 17 (Step 79). If the gas analyzer 4, 5 detects that the process gas still remains in the internal cavity 20, 30 of the load lock chamber 2, 3, the Steps 73 and 75 are repeated until the gas analyzer 4, 5 does not detect any process gas in the internal cavity 20, 30 of the load lock chamber 2, 3.

Moreover, since the processed substrate 100 has been cooled down by the cooling gas in the internal cavity 20, 30 of the load lock chamber 2, 3 and the temperature of the processed substrate 100 is cooled down to be substantially equal to the room temperature, there is no condensation formed on the surface of the processed substrate 100 when the processed substrate 100 is transported to the load port 17. The processed substrate 100 may be further used in the making of a semiconductor device.

It will be further appreciated that the foregoing apparatus may be used for cooling the processed substrate transported from the processing chamber into the load lock chamber and cleaning the process gas remaining on the surface of the processed substrate out of the load lock chamber.

According to one embodiment of the present disclosure, a load lock chamber of a semiconductor device manufacturing system comprises an internal cavity, a substrate carrier, configured to support and deliver a substrate and a cooling gas inlet module arranged in the internal cavity and adjacent to a first side of the internal cavity. The cooling gas inlet module is configured to discharge a gas toward a second side of the internal cavity to cool down the substrate supported and delivered by the substrate carrier, wherein the second side is opposite to the first side.

According to another embodiment of the present disclosure, a load lock chamber of a semiconductor device manufacturing system comprises an internal cavity, a substrate loading/unloading port which is provided on a side of the internal cavity and at least two gas ports arranged in the internal cavity. The at least two gas ports are configured to discharge a cooling gas. One of the gas ports is positioned close to the substrate loading/unloading port and the other gas port is positioned away from the substrate loading/unloading port.

According to one embodiment of the present disclosure, a method of operating a semiconductor device manufacturing system comprises: transporting a substrate from a processing chamber into a load lock chamber; discharging a cooling gas into the load lock chamber by cooling gas inlet module arranged within the load lock chamber, wherein the cooling gas is configured to cool down the substrate until a temperature of the substrate is substantially equal to room temperature; pumping gases out of the load lock chamber; and transporting the substrate into a loading station.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A load lock chamber of a semiconductor device manufacturing system, comprising:
   an internal cavity having a first side and a second side opposite to the first side;
   a substrate carrier, configured to support and transport a substrate from the first side of the internal cavity to the second side of the internal cavity; and
   a cooling gas inlet module arranged within the internal cavity and above the substrate carrier and the substrate supported and transported by the substrate carrier;
   wherein the cooling gas inlet module has at two least gas ports directly facing the substrate carrier and/or the substrate supported and transported by the substrate carrier, wherein one of the gas port is arranged to be adjacent to the first side of the internal cavity and the other gas port is arranged to be adjacent to the second side of the internal cavity, and wherein each gas port is configured to discharge a gas which flows substantially downward toward the substrate carrier and/or the substrate supported and transported by the substrate carrier so as to cool down the substrate supported and transported by the substrate carrier.

2. The load lock chamber of claim 1, wherein the cooling gas inlet module comprises a gas pipeline with the at least two gas ports, and wherein the gas pipeline extends along a substrate transport direction.

3. The load lock chamber of claim 2, wherein the gas pipeline comprises a plurality of the gas ports arranged between the at least two gas ports, and wherein the plurality of the gas ports are aligned along a lengthwise direction of the gas pipeline and directly face the substrate carrier and/or the substrate supported and transported by the substrate carrier.

4. The load lock chamber of claim 1, wherein the cooling gas inlet module comprises two gas pipelines which extend along a direction different from a substrate transport direction, and wherein the at least two gas ports are respectively arranged on the two gas pipelines.

5. The load lock chamber of claim 4, wherein each of the gas pipelines comprises a plurality of gas ports, and wherein the plurality of the gas ports are aligned along a lengthwise direction of the gas pipeline and directly face the substrate carrier and/or the substrate supported and transported by the substrate carrier.

6. The load lock chamber of claim 1, wherein a temperature of the gas discharged from the cooling gas inlet module is lower than room temperature.

7. The load lock chamber of claim 1, wherein the gas discharged from the cooling gas inlet module comprises an inert gas.

8. The load lock chamber of claim 7, wherein the inert gas comprises nitrogen, argon, helium, or combinations thereof.

9. The load lock chamber of claim 1, further comprising a gas analyzer connected to the load lock chamber and configured to detect and analyze an internal environment of the internal cavity.

10. The load lock chamber of claim 1, further comprising a pumping port and a gas analyzer, wherein the pumping port is in fluid communication with the internal cavity and wherein the gas analyzer is connected to the pumping port.

11. A load lock chamber of a semiconductor device manufacturing system, comprising:
an internal cavity,
a substrate loading/unloading port which is provided on a first lateral side of the internal cavity; and
at least two gas ports arranged within the internal cavity and adjacent to an upper side of the internal cavity, wherein the at least two gas ports directly face a lower side of the internal cavity, and wherein one of the gas ports is positioned close to the substrate loading/unloading port and the other gas port is positioned away from the substrate loading/unloading port; wherein each gas port is configured to discharge a cooling gas such that the cooling gas flows from the gas port and substantially downward toward the lower side of the internal cavity.

12. The load lock chamber of claim 11 wherein the cooling gas comprises an inert gas.

13. The load lock chamber of claim 12, wherein the inert gas comprises nitrogen, argon, helium, or combinations thereof.

14. The load lock chamber of claim 11, wherein the gas ports are formed at a single gas pipeline, and wherein the single gas pipeline extends along a direction which is substantially parallel to a direction extending from the first lateral side of the internal cavity to a second lateral side of the internal cavity, and wherein the second lateral side of the internal cavity is opposite to the first lateral side of the internal cavity.

15. The load lock chamber of claim 11, wherein the gas ports are respectively formed at two gas pipelines, and wherein each of the gas pipelines extends along a direction which is substantially perpendicular to a direction extending from the first lateral side of the internal cavity to a second lateral side of the internal cavity, and wherein the second lateral side of the internal cavity is opposite to the first lateral side of the internal cavity.

16. A method of manufacturing a semiconductor device, comprising:
transporting a substrate from a processing chamber into a load lock chamber;
passing the substrate from a first lateral side of the load lock chamber to a second lateral side of the load lock chamber, wherein the first lateral side of the load lock chamber is opposite to the second lateral side of the load lock chamber;
discharging a cooling gas into the load lock chamber by cooling gas inlet module arranged within the load lock chamber, wherein the cooling gas is configured to cool down the substrate until a temperature of the substrate is substantially equal to room temperature, wherein the cooling gas flows from at least two gas ports to the substrate directly, and wherein the at least two gas ports is arranged above the substrate and directly face the substrate, and wherein one of the at least two gas ports is adjacent to the first lateral side of the load lock chamber and the other gas port is adjacent to the second lateral side of the load lock chamber;
pumping gases out of the load lock chamber; and
transporting the substrate into a loading station.

17. The method of claim 16, further comprising: detecting and analyzing an internal environment of the load lock chamber by a gas analyzer.

18. The method of claim 17, wherein the substrate is transported from the load lock chamber into the loading station after the gas analyzer detects that there is no process gas in the load lock chamber.

19. The load lock chamber of claim 14, wherein the single gas pipeline further comprises a plurality of gas ports, and wherein the plurality of gas ports are aligned along the direction which is substantially parallel to the direction extending from the first lateral side of the internal cavity to the second lateral side of the internal cavity.

20. The load lock chamber of claim 15, wherein each of the gas pipelines further comprises a plurality of gas ports, and wherein the plurality of gas ports are aligned along the direction which is substantially perpendicular to the direction extending from the first lateral side of the internal cavity to the second lateral side of the internal cavity.

* * * * *